United States Patent
Ohashi et al.

(10) Patent No.: US 10,542,650 B2
(45) Date of Patent: Jan. 21, 2020

(54) DATA PROCESSING DEVICE PROVIDING STATUS INFORMATION TO BE USED BY BOARD WORKING MACHINE

(71) Applicant: FUJI CORPORATION, Chiryu (JP)

(72) Inventors: Teruyuki Ohashi, Anjo (JP); Shigenao Otane, Himeji (JP)

(73) Assignee: FUJI CORPORATION, Chiryu (JP)

( * ) Notice: Subject to any disclaimer, the term of this patent is extended or adjusted under 35 U.S.C. 154(b) by 331 days.

(21) Appl. No.: 14/914,487

(22) PCT Filed: Sep. 2, 2013

(86) PCT No.: PCT/JP2013/073493
§ 371 (c)(1),
(2) Date: Feb. 25, 2016

(87) PCT Pub. No.: WO2015/029244
PCT Pub. Date: Mar. 5, 2015

(65) Prior Publication Data
US 2016/0212898 A1 Jul. 21, 2016

(51) Int. Cl.
*H05K 13/08* (2006.01)
(52) U.S. Cl.
CPC .................. *H05K 13/08* (2013.01)
(58) Field of Classification Search
CPC ........ G05B 19/409; G05B 2219/36195; H05K 13/08
See application file for complete search history.

(56) References Cited

U.S. PATENT DOCUMENTS 4,513,390 A * 4/1985 Walter .................... G06F 3/005
345/501
4,706,187 A * 11/1987 Arai .................... G05B 19/4097
29/710

(Continued)

FOREIGN PATENT DOCUMENTS

JP 7-221494 A 8/1995
JP 2003-241928 A 8/2003

(Continued)

OTHER PUBLICATIONS

International Search Report dated Oct. 1, 2013, in PCT/JP2013/073493 filed Sep. 2, 2013.

(Continued)

*Primary Examiner* — Minh N Trinh
(74) *Attorney, Agent, or Firm* — Oblon, McClelland, Maier & Neustadt, L.L.P.

(57) ABSTRACT

A data processing device which processes electronic data used by a board working machine is disclosed. The data processing device includes a status information processing section which performs at least one of writing processing, editing processing, and reading processing of status information, with respect to the electronic data. The status information at least illustrates whether or not the electronic data has not been completed. Preferably, the status information illustrates any of (1) the electronic data has not been completed, (2) the electronic data has been completed, and is waiting for a test by the board working machine, (3) the electronic data has been tested by the board working machine, and is waiting for authorization, and (4) the electronic data has been authorized.

9 Claims, 8 Drawing Sheets

(56) References Cited

U.S. PATENT DOCUMENTS

| | | | |
|---|---|---|---|
| 5,266,877 A | | 11/1993 | Takahashi et al. |
| 5,507,004 A | * | 4/1996 | Mito ................... G06F 13/385 |
| | | | 710/34 |
| 8,549,735 B2 | * | 10/2013 | Sumi ................ H05K 13/0061 |
| | | | 29/739 |
| 2007/0270992 A1 | | 11/2007 | Nishida et al. |
| 2009/0077106 A1 | | 3/2009 | Kawase et al. |
| 2009/0225304 A1 | * | 9/2009 | Hiyoshi ............ H05K 13/0452 |
| | | | 356/72 |
| 2016/0212898 A1 | * | 7/2016 | Ohashi ................ G05B 19/409 |

FOREIGN PATENT DOCUMENTS

| | | |
|---|---|---|
| JP | 2004-207762 A | 7/2004 |
| JP | 2004-327585 A | 11/2004 |
| JP | 2006-80313 A | 3/2006 |
| JP | 2008-277527 A | 11/2008 |
| JP | 2012-134603 A | 7/2012 |

OTHER PUBLICATIONS

Extended European Search Report dated Mar. 9, 2017 in Patent Application No. 13892404.8.
Japanese Office Action dated Oct. 3, 2017 in Japanese Patent Appiication No. 2015-533911.

* cited by examiner

FIG.2

| Production Program Production Item:CB001 Board Used:CS025 ||||| 
|---|---|---|---|---|
| Mounting Order | Electronic Component | Feeder | Mounting Position | ..... |
| 1 | P001 | F01 | X1,Y1 | · |
| 2 | P002 | F02 | X2,Y2 | · |
| 3 | P003 | F03 | X3,Y3 | · |
| 4 | P004 | F04 | X4,Y4 | · |
| 5 | P005 | F05 | · | · |
| 6 | · | · | · | · |
| 7 | · | · | · | · |
| · | · | · | · | |
| · | · | · | | |
| · | · | | | |

A    B    C    D

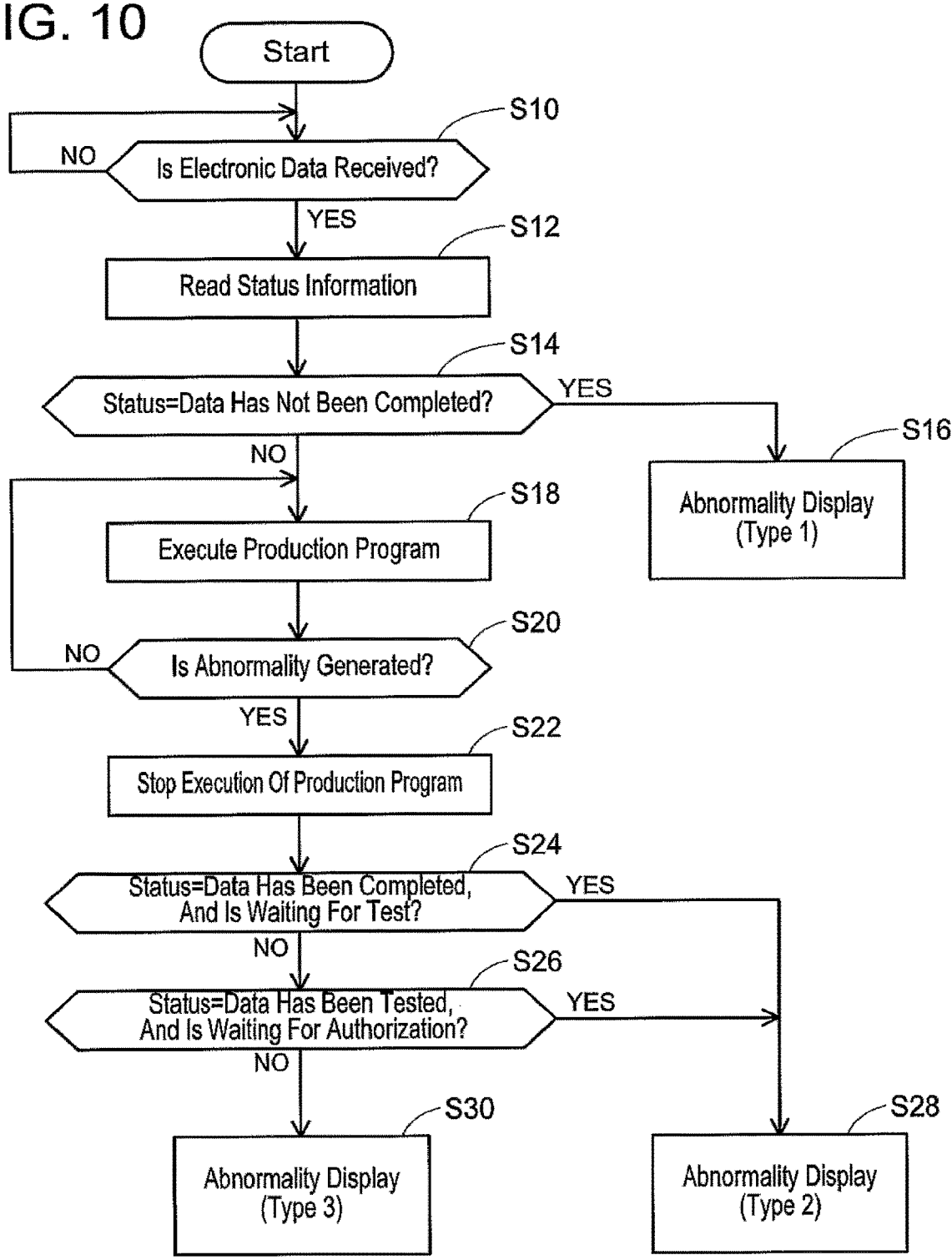

DATA PROCESSING DEVICE PROVIDING STATUS INFORMATION TO BE USED BY BOARD WORKING MACHINE

TECHNICAL FIELD

The present description relates to a board working machine which performs predetermined work on a circuit board, and particularly to a technology for processing data used in the board working machine.

BACKGROUND ART

As aboard working machine, for example, a solder printing machine, an electronic component mounting machine, and a board inspection machine are known. The solder printing machine is a device for printing solder on a circuit board, the electronic component mounting machine is a device for mounting an electronic component on the circuit board, and the board inspection machine is a device for optically inspecting the circuit board. In general, the solder printing machine, the electronic component mounting machine, and the board inspection machine are disposed in series, and configure an electronic component mounting line for mounting the electronic component on the circuit board.

In the board working machine, electronic data which is prepared in advance is used, and based on the electronic data, an operation of the machine is controlled. For example, in the electronic component mounting machine, a production program and part data are used. The production program is electronic data which describes both mounting positions of a plurality of electronic components to be mounted on the circuit board and a mounting order thereof. The part data is electronic data which is prepared for each type of electronic component, and describes operation conditions which correspond to the electronic component. An example of the data used by the board working machine is described in PTL 1.

CITATION LIST

Patent Literature

PTL 1: JP-A-2008-277527

BRIEF SUMMARY

Problem to be Solved

The electronic data used by the board working machine is generally created offline by a user. The user who creates the electronic data inputs data values to each of a plurality of data items determined in advance. In the plurality of data items, mandatory items to which the data value is indispensably input, and optional items to which the data value is arbitrarily input, are present. In the work of creating the electronic data, it is necessary to input the data value to at least all of the mandatory items. When the electronic data has not been completed, that is, when a mandatory item to which the data value has not been input is present, the board working machine cannot correctly operate.

It is possible to confirm whether or not the electronic data is completed by referring to contents of the electronic data. However, the work of confirming input/non-input of the data value one by one with respect to all of the data items (or, at least all of the mandatory items) is troublesome to the user.

In consideration of the above-described situation, the present description provides a technology which can make it easy to confirm a status of the electronic data, for example, whether or not the electronic data is completed.

Means for Solving the Problem

The technology disclosed in the present description gives status information to the electronic data used by the board working machine. Since the electronic data includes the status information, the user can easily confirm the status of the electronic data whether or not the electronic data is completed. Furthermore, when the electronic data includes the status information, it is possible to prevent the electronic data which has not been completed from being incorrectly used by the board working machine, in advance.

According to an aspect of the technology, the present description discloses a data processing device which processes electronic data used by a board working machine. This data processing device includes a status information processing section which performs at least one of writing processing, editing processing, and reading processing of status information, with respect to the electronic data. It is preferable that the status information at least illustrates whether or not the electronic data has not been completed.

The electronic data used by the board working machine is generally created via a plurality of steps. In general, in the first step, the user inputs data values to each of data items, and completes the electronic data. In the second step, the completed electronic data is tested by the board working machine. In the third step, based on the test result by the board working machine, the electronic data is authorized. In consideration of the steps, the status information may describe the status of the electronic data in more detail.

Accordingly, it is preferable that the status information further illustrates whether or not the electronic data has been tested by the board working machine.

In addition to this, or instead of this, it is preferable that the status information further illustrates whether or not the electronic data has been authorized.

According to an embodiment of the technology, it is preferable that the status information illustrates any of (1) the electronic data has not been completed, (2) the electronic data has been completed, and is waiting for a test by the board working machine, (3) the electronic data has been tested by the board working machine, and is waiting for authorization, and (4) the electronic data has been authorized. Accordingly, the user can ascertain the status of the electronic data in more detail, and can rapidly perform appropriate processing with respect to the electronic data.

The data processing device according to the technology may be a computer device which is used by a user for creating the electronic data, may be a control device which is provided in the board working machine, or may be a display device which simply displays contents of the electronic data. All devices which can perform at least one of the writing processing, the editing processing, and the reading processing of status information, with respect to the electronic data, are included in the data processing device according to the technology.

BRIEF DESCRIPTION OF DRAWINGS

FIG. 2 is a view illustrating contents of a production program which is an example of data used by an electronic component mounting machine.

FIG. 10 is a flowchart illustrating a process which is performed by a control device of the electronic component mounting machine.

DESCRIPTION OF EMBODIMENTS

Figure 1:
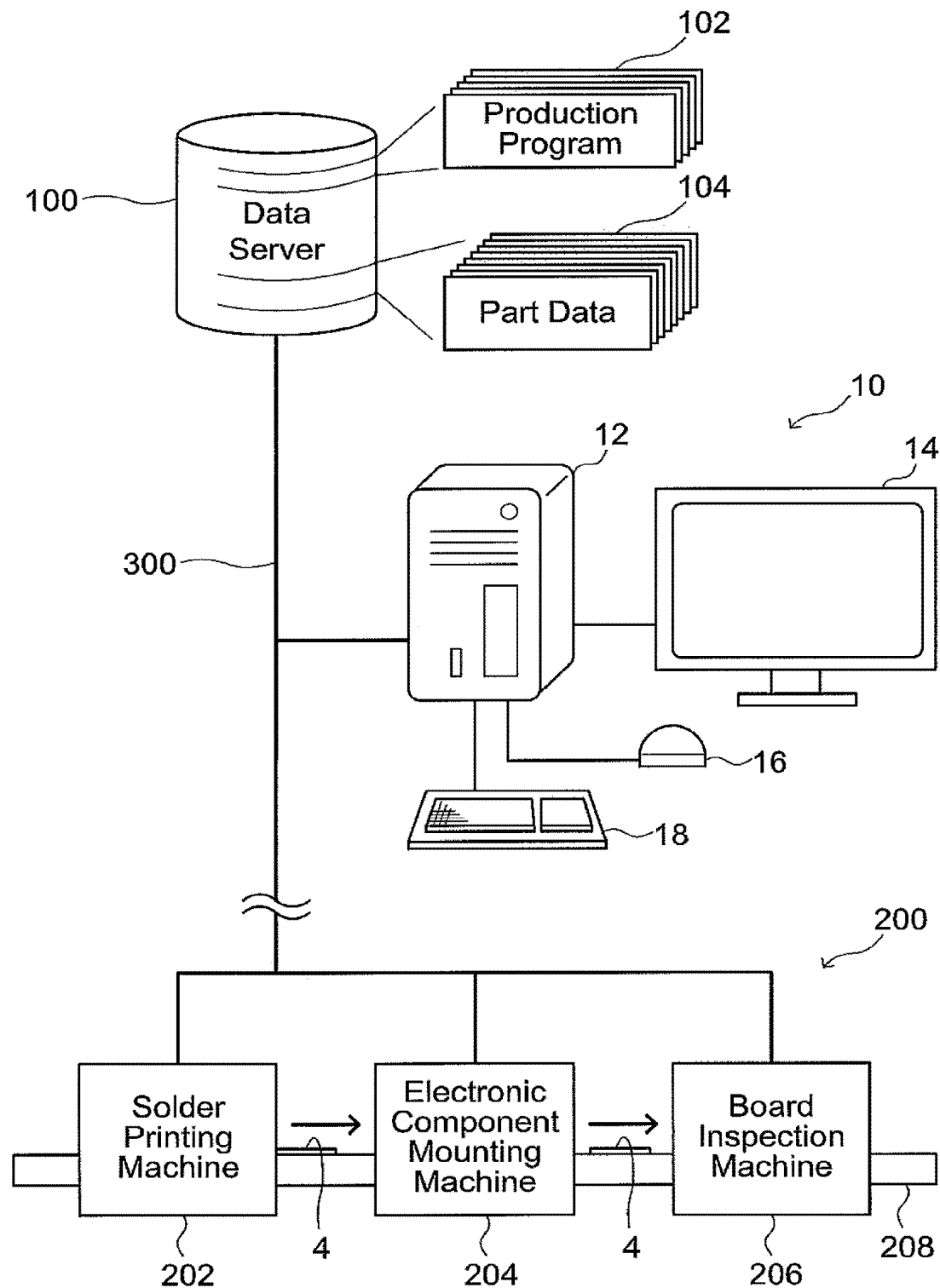
FIG. 1 is a view illustrating a configuration of an electronic component mounting system.

In one embodiment of the technology, it is preferable that a data processing section further includes a display section which displays identification information (for example, name of data) and status information of electronic data to be visually recognized.

In the above-described embodiment, it is preferable that the display section displays the status information by using an icon.

In the above-described embodiment, it is preferable that the display section displays the identification information and the status information of the plural pieces of electronic data at the same time.

In the above-described embodiment, it is preferable that the display section selectively displays only the electronic data to which certain status information is given, among the plural pieces of electronic data. In this configuration, the display section can selectively display, for example, only the electronic data which has not been completed.

In the embodiment of the technology, the electronic data used by the board working machine may be an aggregate of plural pieces of partial electronic data, and may include the status information with respect to each of the plural pieces of partial electronic data. In this case, it is preferable that the display section selectively displays one piece of status information in accordance with priority determined in advance when the electronic data includes the plural pieces of status information which are different from each other.

In the embodiment of the technology, a data processing device may further include a sending processing section which sends the electronic data to the board working machine. In this case, it is preferable that the sending processing section obtains the status information of the electronic data before sending the electronic data, and stops sending the electronic data when the obtained status information illustrates that the electronic data has not been completed. In this configuration, it is possible to prevent the electronic data which has not been completed from being incorrectly used by the board working machine, in advance.

In the embodiment of the technology, the board working machine can include an electronic component mounting machine for mounting a plurality of electronic components on a circuit board. In this case, it is preferable that the electronic data used by the board working machine includes the electronic data used by the electronic component mounting machine. In the electronic data used by the electronic component mounting machine, multiple data items to which the user is supposed to input data values are present. The technology can be appropriately employed with respect to such electronic data.

In the above-described embodiment, it is preferable that the electronic data is part data which describes operation conditions that correspond to the electronic component, or a production program which describes both mounting positions of the plurality of electronic components to be mounted on the circuit board and a mounting order thereof. In addition, there is also a case where the production program further describes a quantity of production or delivery date, and is called job data.

In the embodiment of the technology, a board working system is disclosed. The board working system includes: the data processing device according to the technology; and a board working machine which uses electronic data in which status information is written by the data processing device. It is preferable that the board working machine obtains the status information of the electronic data before using the electronic data, and stops using the electronic data when the obtained status information illustrates that the electronic data has not been completed. In this configuration, it is possible in the board working machine to prevent the electronic data which has not been completed from being incorrectly used by the board working machine, in advance.

In the above-described embodiment, it is preferable that the board working machine selectively displays predetermined information to an operator in accordance with the status information of the electronic data which is in use when an abnormality is detected and the operation of the board working machine is stopped. For example, when an abnormality is generated in the board working machine, in a case where the electronic data which is in use has a status of pre-authorization, the possibility that a defect is generated in the electronic data is high. Meanwhile, when the electronic data which is in use has a status of post-authorization, there is not a problem in the electronic data, and the possibility that a defect is generated in the board working machine is high. Based on this knowledge, the board working machine can be configured to display information which is useful to the operator in accordance with the obtained status information.

EXAMPLE

An electronic component mounting system of an example will be described with reference to the drawings. The electronic component mounting system is an example of the board working system, and is a system for mounting an electronic component on a circuit board. As illustrated in FIG. 1, the electronic component mounting system of the example includes a data management device 10, a data server 100, and an electronic component mounting line 200. The data management device 10, the data server 100, and the plurality of electronic component mounting lines 200 are connected to each other via an electric communication line 300 to be communicable.

The electronic component mounting line 200 includes a solder printing machine 202, an electronic component mounting machine 204, and a board inspection machine 206. The solder printing machine 202, the electronic component mounting machine 204, and the board inspection machine 206 are respectively board working machines which perform predetermined work on a circuit board 4, and are disposed along a board conveyor 208 which transports the circuit board 4. The solder printing machine 202 is a device for printing cream solder on the circuit board 4. The electronic component mounting machine 204 (hereinafter, referred to as a mounting machine 204) is a device for mounting a plurality of electronic components on the circuit board 4 on which the cream solder is printed. In addition, the board inspection machine 206 is a device for optically (that is, by using a camera) inspecting the circuit board 4 on which the electronic components are mounted. In general, the electronic component mounting line 200 includes the plurality of mounting machines 204. The electronic component mounting line 200 may further include a device for supplying the circuit board 4 to the board conveyor 208, and a reflow furnace for reflowing the cream solder of the circuit board 4.

The data server 100 is a device for storing various pieces of data used by the electronic component mounting line 200. For example, the data server 100 stores a plurality of production programs 102 and plural pieces of part data 104. The production program 102 and the part data 104 are data used by the mounting machine 204. These pieces of data are sent and received between the data server 100, the data management device 10, and the mounting machine 204 through the electric communication line 300.

FIG. 2 illustrates an example of the production program 102. As illustrated in FIG. 2, the production program 102 is electronic data which is prepared for each production item (for example, CB001), and describes the plurality of electronic components (column B) to be mounted on the circuit board 4, together with a mounting order (column A), positions of feeders (column C) which supply the electronic components, mounting positions (column D) on the circuit board 4, and other information. By executing the production program 102, the mounting machine 204 mounts the plurality of electronic components described in the production program 102 to each of the mounting positions determined on the circuit board 4. The production program 102 is created by the user or the operator by using the data management device 10.

Figure 3:
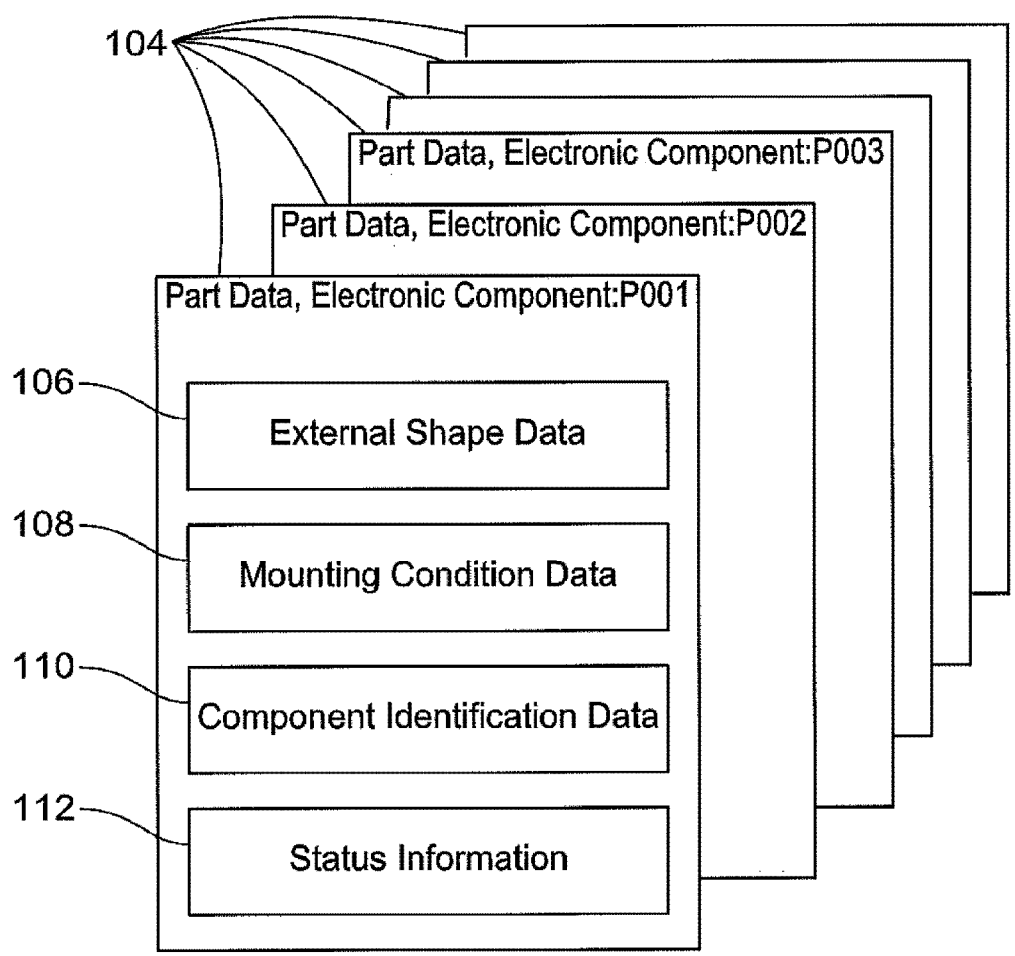
FIG. 3 is a view illustrating contents of part data which is an example of the data used by the electronic component mounting machine.

FIG. 3 illustrates an example of the part data 104. The part data 104 is data which is prepared for each type (P001, P002, . . . ) of the electronic components, and describes operation conditions of the mounting machine 204 in accordance with the electronic component. When mounting each electronic component on the circuit board 4, the mounting machine 204 refers to the part data 104 of the electronic component, and operates on the operation conditions described in the part data 104. In other words, the mounting machine 204 changes the operation in accordance with the electronic components to be mounted.

For example, the part data 104 includes external shape data 106, mounting condition data 108, and component identification data 110. The external shape data 106 is data which describes information related to an external shape of the electronic component, and includes each dimension or drawing data of the electronic component. The mounting condition data 108 is data which describes the operation conditions related to the mounting of the electronic component, and includes a nozzle used, a suction condition of the nozzle, a moving speed of the nozzle, or the like. The component identification data 110 is data which describes the operation conditions related to identification of the electronic component, and includes an imaging direction of the electronic component by the camera, an illumination direction when imaging is performed, pattern matching data, or the like.

The part data 104 is created by the user by using the data management device 10. The user who creates the part data 104 inputs data values to each of a plurality of data items in the external shape data 106, the mounting condition data 108, and the component identification data 110. In the plurality of data items, mandatory items to which the data value is indispensably input, and optional items to which the data value is arbitrarily input, are present. In the work of creating the part data 104, it is necessary to input the data values to at least all of the mandatory items. When the part data 104 has not been completed, that is, when a mandatory item to which the data value has not been input is present, the mounting machine 204 cannot correctly operate.

Regarding this, the part data 104 of the example further includes status information 112 (refer to FIG. 3). The status information 112 is information illustrating a status in the creating process of the part data 104. In general, the part data 104 is created via a plurality of steps. In the first step, the user inputs the data values to each of the data items, and the part data 104 is completed. In the second step, the completed part data 104 is tested by the mounting machine 204. In the third step, based on the test result by the mounting machine 204, the part data 104 is authorized. The status information 112 is information illustrating in which step the part data 104 is, in the creating process.

For example, the status information 112 of the example illustrates any of "the data has not been completed," "the data has been completed, and is waiting for the test," "the data has been tested, and is waiting for authorization," and "the data has been authorized." In addition, a case where the part data 104 has not been completed means a state where the input of the data value to all of the mandatory items among the plurality of data items in the part data 104 is not finished. The status information 112 is written and updated by the data management device 10 as follows. In addition, not being limited to the part data 104, the status information 112 can be similarly given to various pieces of electronic data used by the board working machine.

Next, the data management device 10 will be described. The data management device 10 is a device for operating various pieces of electronic data stored in the data server 100 by the user. As illustrated in FIG. 1, the data management device 10 includes an electronic computer 12, a display 14, a mouse 16, and a keyboard 18. The display 14, the mouse 16, and the keyboard 18 are connected to the electronic computer 12. The mouse 16 and the keyboard 18 are user interfaces, and the operator can perform various instructions with respect to the electronic computer 12 using the mouse 16 and the keyboard 18.

Figure 4:
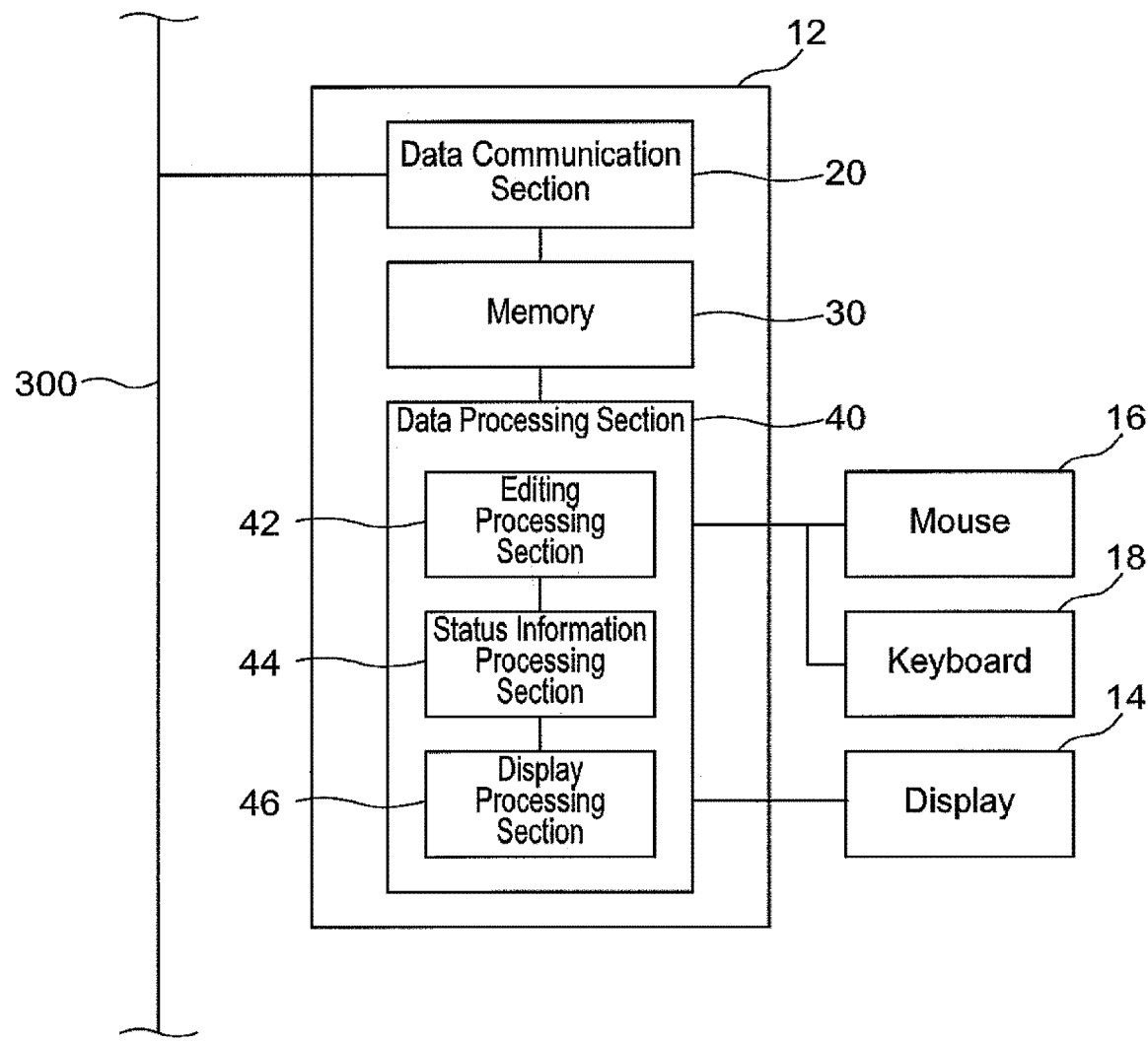
FIG. 4 is a block diagram illustrating a configuration of a data management device.

FIG. 4 is a block diagram illustrating a configuration of the data management device 10. As illustrated in FIG. 4, the electronic computer 12 is provided with a data communication section 20, a memory 30, and a data processing section 40. The data communication section 20 connects the data server 100 and the electronic component mounting line 200 to each other via the electric communication line 300 to be communicable. The memory 30 temporarily stores electronic data obtained from the data server 100 by the data communication section 20, and data created by the data processing section 40.

The data processing section 40 mainly includes an editing processing section 42, a status information processing section 44, and a display processing section 46. The editing processing section 42 edits the part data 104 and other electronic data based on the instruction of the operator. The status information processing section 44 performs the writing processing, the editing processing, and the reading processing of the status information 112 with respect to the part data 104. Each processing is performed based on the instruction of the user. The display processing section 46 displays an editing screen of the part data 104 and the other electronic data on the display 14. The user inputs the data values to each of the data items using the mouse 16 or the keyboard 18, through the editing screen displayed on the display 14. In addition, the display processing section 46 can display the status information 112 read by the status information processing section 44 together with a data name 104a (an example of the identification information) of the part data 104, to be visually recognized on the display 14.

Figure 5:
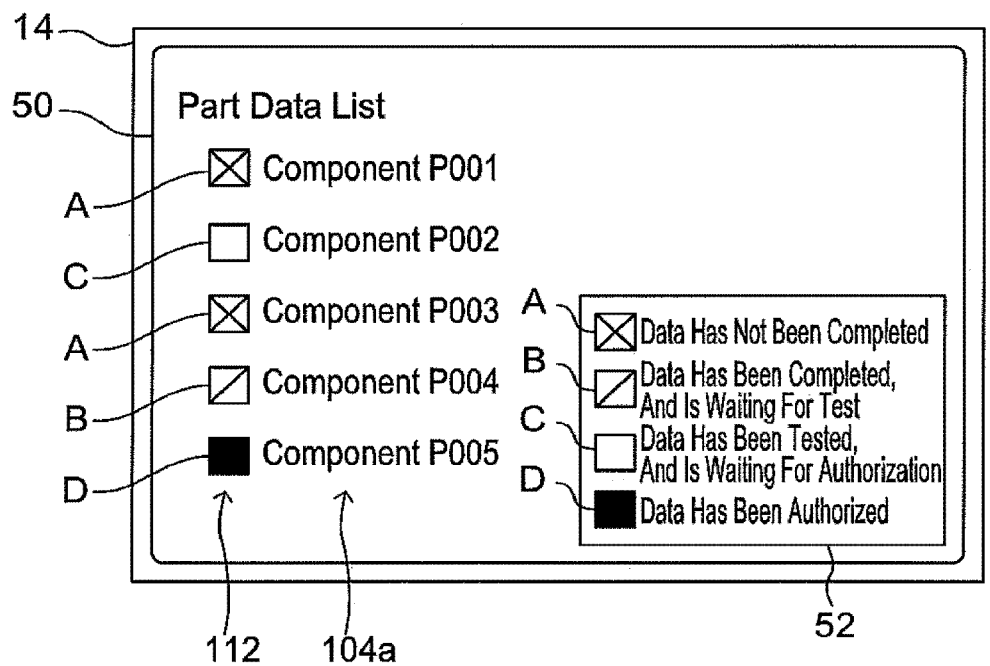
FIG. 5 is a view illustrating an example of a display screen by the data management device.

FIG. 5 illustrates an example of a display screen 50 which is displayed on the display 14 by the data management device 10. As illustrated in FIG. 5, the data management device 10 can simultaneously display the data names 104a of the plural pieces of part data 104 together with each of the status information 112 in the form of a list. The status information 112 is displayed by using icons A to D. Therefore, the user can easily ascertain the status of the plural pieces of the part data 104. In addition, as illustrated in explanatory notes 52 in FIG. 5, each of the icons A to D respectively illustrates "the data has not been completed", "the data has been completed, and is waiting for the test", "the data has been tested, and is waiting for authorization", and "the data has been authorized". In addition, specific aspects of the icons A to D, that is, the shape, the mode, the color, and the operation of the icons A to D are not particularly limited.

Figure 6:
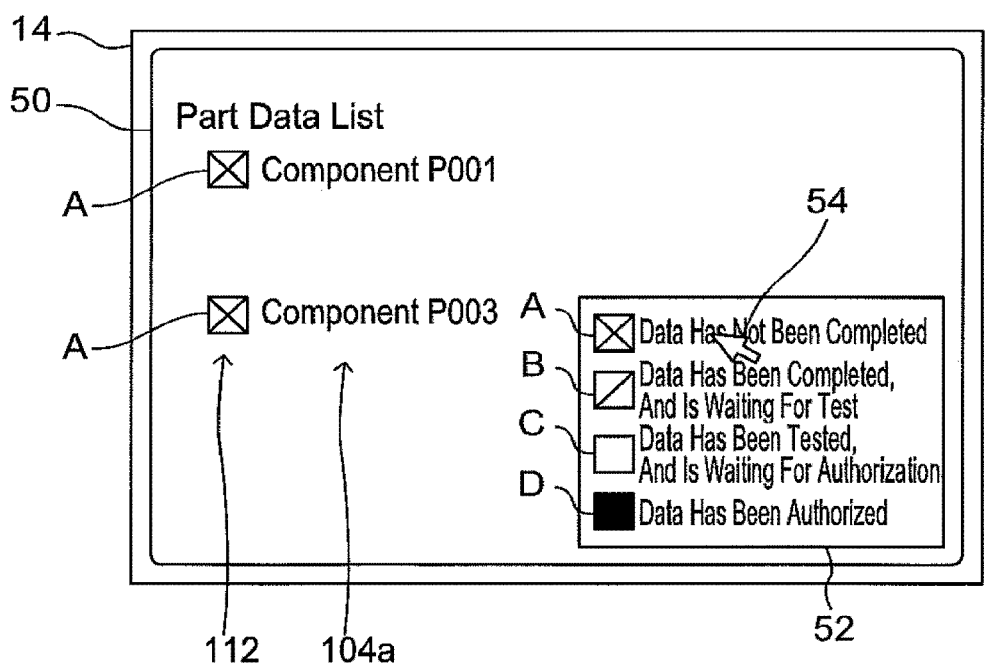
FIG. 6 is a view illustrating an example of the display screen by the data management device.

The data management device 10 can selectively display only the part data 104 including the certain status information 112 based on the instruction of the user. For example, as illustrated in FIG. 6, when the user selects one status (for example, icon A) in the explanatory notes 52 using a mouse pointer 54, the data management device 10 of the example selectively displays only the data name 104a of the part data 104 of the corresponding status (icon A). In this configuration, the user can easily ascertain only the part data 104 which has a certain status.

Figure 7:
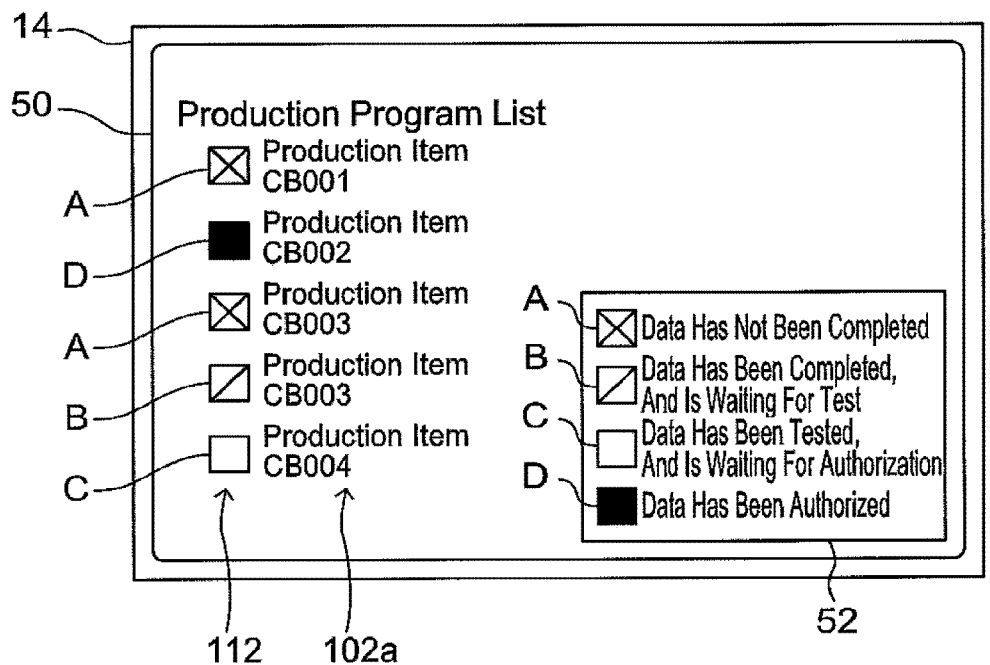
FIG. 7 is a view illustrating an example of the display screen by the data management device.
Figure 8:
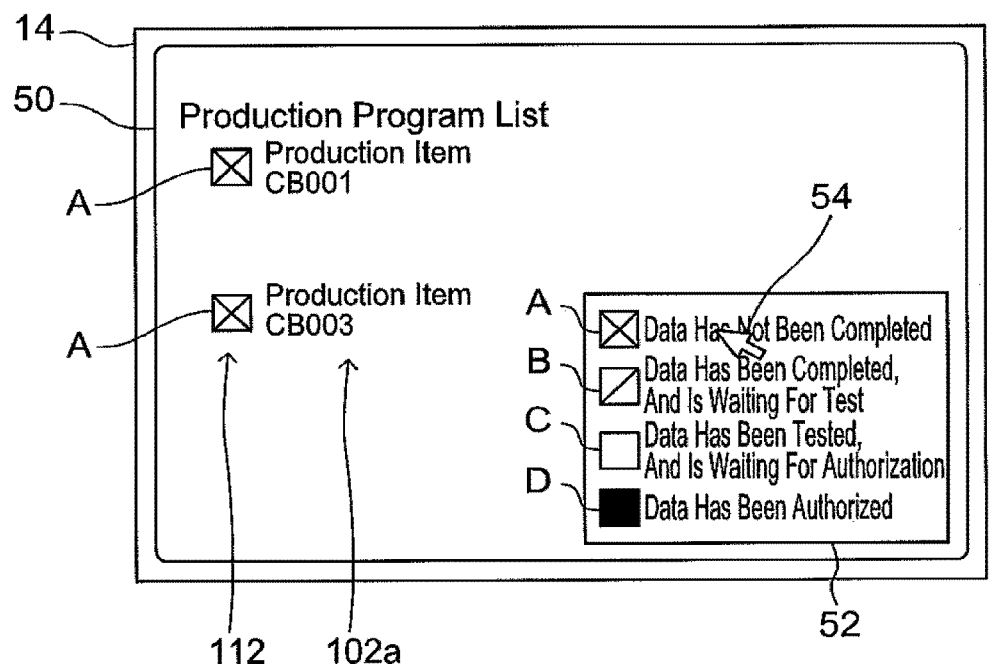
FIG. 8 is a view illustrating an example of the display screen by the data management device.

As illustrated in FIG. 7, the data management device 10 can simultaneously display data names 102a (an example of the identification information) of the plurality of production programs 102 in the form of a list. In this case, the status information processing section 44 reads each piece of the status information 112 from the part data 104 of the plurality of electronic components (refer to the column B of FIG. 2) described in the production program 102, regarding each of the production programs 102. In addition, the display processing section 46 selectively displays one status information 112 in accordance with priority determined in advance among the plural pieces of read status information 112. As a result, on the display 14, the data names 102a of the plurality of production programs 102 are displayed together with the icons A to D which illustrate each of the status information 112. Here, the priority of the status information 112 to be displayed can be appropriately determined based on various points of view, such as a proceeding state of creating the data or a degree of importance of the electronic component. In addition, as illustrated in FIG. 8, the data management device 10 can selectively display only the production program 102 including the certain status information 112 based on the instruction of the user. In addition, when the user selects one of the displayed production programs 102, the list of the part data 104 including the status information 112 displayed by the production program 102 may be displayed.

The data management device 10 can send the electronic data stored in the data server 100 to each of the devices 202, 204, and 206 that configure the electronic component mounting line 200, by the data communication section 20. For example, the data communication section 20 sends the production program 102 together with the part data 104 of the plurality of electronic components described in the production program 102, from the data server 100 to the mounting machine 204. At this time, the data communication section 20 obtains the status information 112 from each of the part data 104. In addition, when at least one of the read status information 112 illustrates that the part data 104 has not been completed, the sending of the production program 102 and the part data 104 is stopped. Accordingly, the electronic data which has not been completed is prevented from being incorrectly used by the mounting machine 204 in advance. Meanwhile, when all of the read status information 112 illustrates that the part data 104 has been completed, the data communication section 20 sends the production program 102 and the part data 104. At this time, when information which illustrates that the part data 104 has not been authorized (for example, "the data has been completed, and is waiting for the test," or "the data has been tested, and is waiting for authorization") is included in the read status information 112, for example, it is preferable that the display processing section 46 displays component names (or other identification information) of the part data 104 on the display 14. In this configuration, when the sent electronic data is used by the mounting machine 204, the user and the operator can ascertain the electronic component in which the part data 104 has not been authorized in advance, and can confirm the operation of the mounting machine 204 with respect to the electronic component, in priority.

Figure 9:
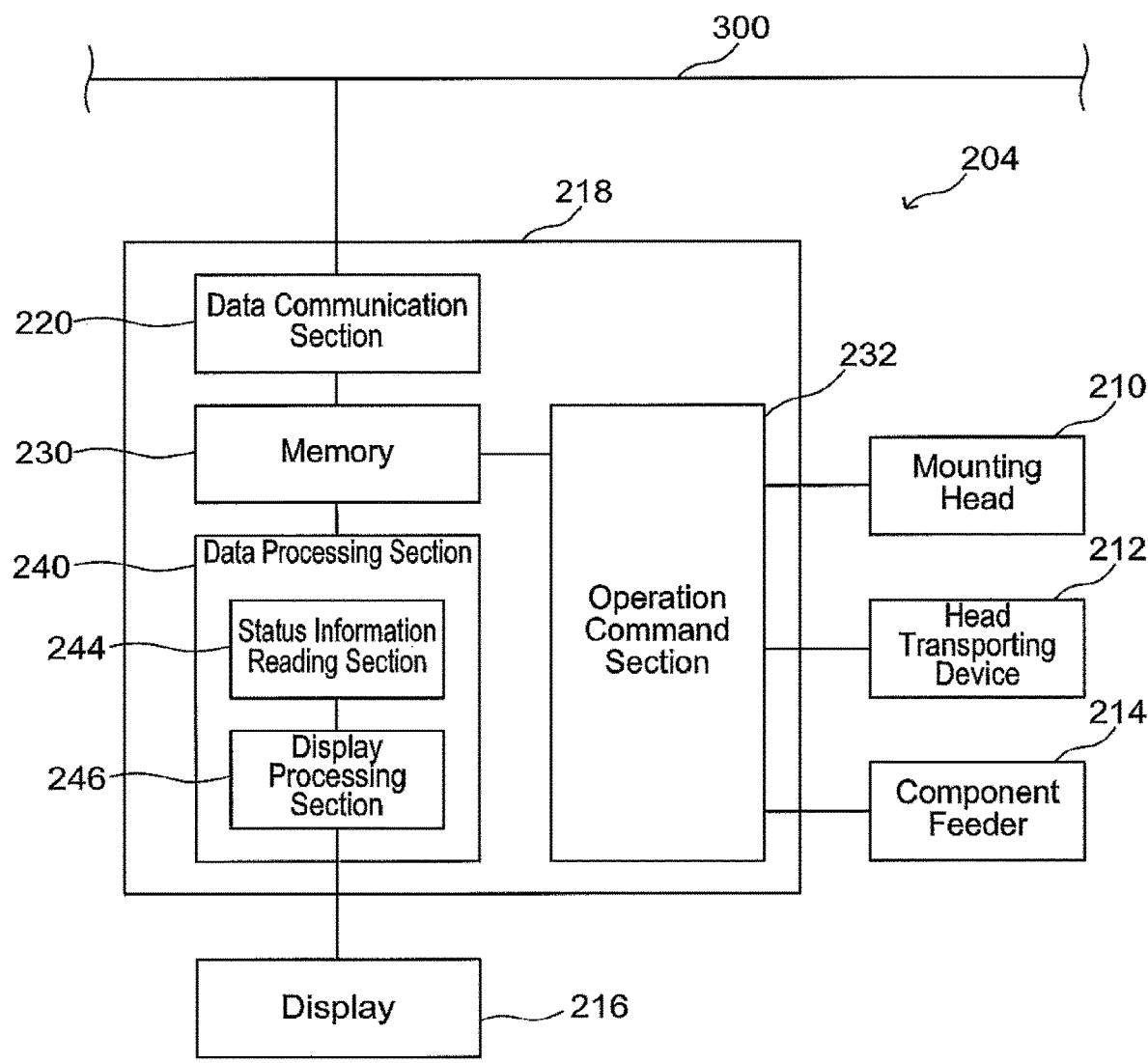
FIG. 9 is a block diagram illustrating a configuration of the electronic component mounting machine.

Next, with reference to FIG. 9, the mounting machine 204 will be described. The mounting machine 204 mainly includes a mounting head 210 which mounts the electronic component on the circuit board 4, a head transporting device 212 which transports the mounting head 210 to the circuit board 4, a component feeder 214 which supplies the electronic component to the mounting head 210, a display 216, and a control device 218 which controls the mounting head 210, the head transporting device 212, the component feeder 214, and the display 216.

The control device 218 includes a data communication section 220, a memory 230, an operation command section 232, and a data processing section 240. The data communication section 220 connects the data server 100 and the electronic component mounting line 200 to each other via the electric communication line 300 to be communicable. The memory 230 temporarily stores the production program 102 or the part data 104 obtained from the data server 100 by the data communication section 220. The operation command section 232 executes the production program 102 or the part data 104 stored in the memory 230, and gives operation commands to the mounting head 210, the head transporting device 212, and the component feeder 214. Accordingly, the mounting machine 204 mounts the electronic component to the circuit board 4.

The data processing section 240 mainly includes a status information reading section 244 and a display processing section 246. The status information reading section 244 reads the status information 112 from the part data 104. The display processing section 246 displays various pieces of information, such as the operation status of the mounting machine 204 or abnormality display which will be described later, on the display 216.

FIG. 10 illustrates processing executed by the control device 218 of the mounting machine 204. As illustrated in FIG. 10, when receiving the electronic data, such as the production program 102 or the part data 104 by the data communication section 220 (YES in S10), the control device 218 reads the status information 112 included in the electronic data by the status information reading section 244 (S12). When the read status information 112 illustrates that the electronic data has not been completed (YES in S14), the control device 218 performs abnormality display of type 1 on the display 216 by the display processing section 246 (S16). The mounting machine 204 stops the operation thereof. The abnormality display of type 1 notifies the operator that the electronic data which is in use is data which has not been completed, and prompts the operator to reconfirm the electronic data. Accordingly, the mounting machine 204 is prevented from using the electronic data which has not been completed in advance.

If there is not a problem in the status information 112 (NO in S14), the control device 218 starts executing the production program 102 (S18). When executing the production program 102, if any abnormality is detected (YES in S20), the control device 218 stops the execution of the production program 102 (S22). In this case, in accordance with the status information 112 read in advance (S24, S26), the control device 218 performs the abnormality display of type 2 or type 3 (S28, S30).

Specifically, when the status information 112 illustrates "the data has been completed, and is waiting for the test" (YES in S24) or "the data has been tested, and is waiting for authorization" (YES in S26), the control device 218 performs the abnormality display of type 2 on the display 216 by the display processing section 246 (S28). The abnormality display of type 2 notifies the operator that the electronic data which is in use is data which has not been authorized, and prompts the operator to reconfirm the electronic data. Meanwhile, when the status information 112 illustrates "the data has been authorized" (NO in S24 and S26), the control device 218 performs the abnormality display of type 3 on the display 216 by the display processing section 246 (S30). The abnormality display of type 3 notifies the operator that the electronic data which is in use is data which has been authorized, and prompts the operator to reconfirm the mounting machine 204.

In this manner, when the mounting machine 204 detects any abnormality and stops the operation thereof, in accordance with the status information 112 of the electronic data which is in use, the mounting machine 204 selectively performs the abnormality display of type 2 or type 3. Accordingly, the operator of the mounting machine 204 can rapidly specify and remove the reason of the abnormality, and can restart the mounting machine 204 early.

Above, a specific example of the present application is described in detail, but it is merely an example, and the example does not restrict the claimed range. In the technology described in the claimed range, the specific example described above includes various deformations and changes.

In the example, the status information 112 is included only in the part data 104, but the status information 112 may be further included in the production program 102 or other electronic data. In addition, the status information 112 is not limited to the data which is used by the mounting machine 204, and may be included in the electronic data used by other board working machine, such as the solder printing machine 202 or the board inspection machine 206.

The data management device 10 can be configured to automatically give the status information 112 to the electronic data used by the board working machine. In this case, it is preferable that the status information processing section 44 writes the status information 112 which illustrates that the electronic data has not been completed, to the electronic data, when a data item to which the data value is not input is present, and more preferably, when a mandatory item to which the data value is not input is present.

The data management device 10 may be a portable terminal, such as a smartphone or a tablet. In addition, the data management device 10 can be configured to send the status information 112 or the abnormality display of type 1 to type 3 to the portable terminal of the user or the operator, and to use the portable terminal as a display.

Technical elements described in the present description or the drawings achieve technical effectiveness alone or in various combinations, and the present application is not limited to the combination described in applied claims. In addition, the technology described in the present description or the drawings, achieve plural purposes at the same time and has technical effectiveness for achieving one of the purposes.

REFERENCE SIGNS LIST

4: CIRCUIT BOARD
10: DATA MANAGEMENT DEVICE
20: DATA COMMUNICATION SECTION
40: DATA PROCESSING SECTION
44: STATUS INFORMATION PROCESSING SECTION
102: PRODUCTION PROGRAM
104: PART DATA
112: STATUS INFORMATION
200: ELECTRONIC COMPONENT MOUNTING LINE
202: SOLDER PRINTING MACHINE
204: ELECTRONIC COMPONENT MOUNTING MACHINE
206: BOARD INSPECTION MACHINE
208: BOARD CONVEYOR
218: CONTROL DEVICE OF ELECTRONIC COMPONENT MOUNTING MACHINE
220: DATA COMMUNICATION SECTION
240: DATA PROCESSING SECTION
244: STATUS INFORMATION READING SECTION

The invention claimed is:

1. A data processing device which processes electronic part data for a board working machine, the device comprising:
   a display; and
   a control device operatively connected to the display, the control device including:
      a data communication section configured to receive the electronic part data from a data server,
      an operation command section configured to execute operation of the board working machine, and
      a data processing section that includes
         a status information reading section configured to read status information included in the electronic part data, the status information being information illustrating a status in a creating process of the electronic part data, and
         a display processing section configured to display the status information on the display,
   wherein the status information illustrates one of:
      the electronic part data has not been completed,
      the electronic part data has been completed, and is waiting for a test by the board working machine,
      the electronic data has been tested by the board working machine, and is waiting for authorization, or
      the electronic part data has been authorized,
   wherein when the status information illustrates that the electronic part data has not been completed, the operation command section is configured to stop operation of the board working machine and the display processing section is configured to display a first abnormality display on the display, the first abnormality display indicating the electronic part data which is in use is data which has not been completed and including a prompt to reconfirm the electronic part data, wherein when an abnormality is detected and the status information illustrates the electronic part data has been completed, and is waiting for a test by the board working machine or the electronic data has been tested by the board working machine, and is waiting for authorization, the operation command section is configured to stop operation of the board working machine and the display processing section is configured to display a second abnormality display on the display, the second abnormality display indicating the electronic part data which is in use is data which has not been authorized and including a prompt to reconfirm the electronic part data, and wherein when an abnormality is detected and the status information illustrates the electronic part data has been authorized, the operation command section is configured to stop operation of the board working machine and the display processing section is configured to display a third abnormality display on the display, the third abnormality display indicating the electronic part data which is in use is data which has been authorized and including a prompt to reconfirm the board working machine.

2. The data processing device according to claim 1, wherein the display processing section is configured to display the status information on the display by using an icon.

3. The data processing device according to claim 1, wherein the display processing section is configured to display identification information and the status information of plural pieces of electronic part data at the same time on the display.

4. The data processing device according to claim 1, wherein the display processing section is configured to selectively display only one electronic part data to which certain status information is given on the display, among plural pieces of electronic part data.

5. The data processing device according to claim 1, wherein the display processing section is configured to selectively display one piece of status information on the display in accordance with priority determined in advance when the electronic part data includes the plural pieces of status information which are different from each other.

6. The data processing device according to claim 1, wherein the operation command section is configured to send the electronic data to the board working machine, the status information reading section is configured to obtain the status information of the electronic part data before sending the electronic data, and the operation command section is configured to stop sending the electronic part data when the obtained status information illustrates that the electronic part data has not been completed.

7. The data processing device according to claim 1, wherein the board working machine includes an electronic component mounting machine for mounting a plurality of electronic components on a circuit board, and wherein the electronic part data includes electronic data used by the electronic component mounting machine.

8. The data processing device according to claim 7, wherein the electronic part data includes data which describes operation conditions that correspond to the electronic component.

9. The data processing device according to claim 7, wherein the electronic part data includes a production program which describes both the plurality of electronic components to be mounted on the circuit board and a mounting order thereof.

* * * * *